US006987960B2

(12) United States Patent
Kashima

(10) Patent No.: US 6,987,960 B2
(45) Date of Patent: Jan. 17, 2006

(54) MICROWAVE OSCILLATOR AND LOW-NOISE CONVERTER USING THE SAME

(75) Inventor: Yukiro Kashima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 918 days.

(21) Appl. No.: 09/829,483

(22) Filed: Apr. 10, 2001

(65) Prior Publication Data

US 2001/0055958 A1 Dec. 27, 2001

(30) Foreign Application Priority Data

Apr. 10, 2000 (JP) ............................ 2000-107545

(51) Int. Cl.
*H04B 1/26* (2006.01)

(52) U.S. Cl. ................................ 455/318; 331/117 D

(58) Field of Classification Search ................ 455/255, 455/258, 259, 318, 319, 323; 331/99, 117 D, 331/117 FE See application file for complete search history.

(56) References Cited

U.S. PATENT DOCUMENTS

| | | | | |
|---|---|---|---|---|
| 4,713,632 A | | 12/1987 | Nishikawa et al. | |
| 5,752,180 A | * | 5/1998 | Guo et al. | 455/319 |
| 5,834,981 A | * | 11/1998 | Trier et al. | 331/99 |
| 5,940,750 A | | 8/1999 | Wang | |

OTHER PUBLICATIONS

Mizan, M., “An X-Band, 2.5 Watt Continous Wave Dielectric Resonator Oscillator For Future Military Systems”, *IEEE Proceedings of the Frequency Control Symposium*, pp. 409-414 (May 1992.

Lohninger, G. “Fundamentals of Oscillators for the Mirowave Range (Part 2)”, *IEEE Signal Processing Society*, vol. 6, No. 7, pp. 32-34 (Jul. 1999).

European Search Report corresponding to application No. EP 01 10 8601 dated Jul. 8, 2002.

* cited by examiner

*Primary Examiner*—Lee Nguyen
(74) *Attorney, Agent, or Firm*—RatnerPrestia

(57) ABSTRACT

A microwave oscillator for inducing parallel feedback from collector to base and obtaining a stabilized oscillation output is realized by connecting MSL A with released end to a base terminal of a transistor, connecting MSL B to its collector terminal, and disposing a DR closely to the MSL A and B to couple them electromagnetically. The length between the released end and the position of MSL A which is closest to the center of DR is set to λg1/4 (λg1 is the guide wavelength in the MSL A), and HIL is merely connected to this position as a bias supply line to the base terminal. This structure does not require the choke circuits which occupied a relatively wide area on the conventional circuit board, and a small and stable microwave oscillator having excellent phase noise characteristics, and a low-noise converter for receiving satellite signal by using the same are realized.

8 Claims, 6 Drawing Sheets

MICROWAVE OSCILLATOR AND LOW-NOISE CONVERTER USING THE SAME

FIELD OF THE INVENTION

The present invention relates to a microwave oscillator stabilized in frequency by using a dielectric resonator, and a low-noise converter (International Patent Classification H01P1/17) incorporated in a radio wave receiving antenna of broadcast or communication satellite.

BACKGROUND OF THE INVENTION

Recently, along with progress in digital signal compression technology of moving picture or integrated circuit for digital signal processing, in the television broadcast by broadcast satellite or communication satellite, the analog transmission system is being replaced by the digital transmission system which is capable of presenting broadcast and communication services of higher picture quality in multiple channels, and its spread in the general household is highly expected. In this background, there is an increasing demand not only for smaller size and lower cost of low-noise converter used in the receiving antenna of broadcast or communication satellite radio waves, but also for further improvement of phase noise characteristics of the microwave oscillator incorporated in the low-noise converter which has a serious effect on the quality of bit error rate (BER) of decoded signals in the receiver when the quadrature phase shift keying or octantal phase shift keying is employed as the digital transmission system.

FIG. 6 is a circuit diagram of a microwave oscillator hitherto used as the local oscillator of a low-noise converter. At base terminal of a bipolar transistor 1 for microwave oscillation (hereinafter the bipolar transistor is called merely as a transistor be distinguished from the field effect transistor or FET), a microstrip line (MSL) 4*a* is connected. In this line 4*a*, a choke circuit composed of high impedance line (HIL) 6*a* and MSL 4*d*, and a dc voltage divider composed of dc resistances 3*c* and 3*d* are connected serially as shown in the diagram, and one end of the resistance 3*c* is connected to a bias supply terminal 2*b* of the transistor, and a bias voltage is applied to the base terminal therefrom. A capacitor 7*c* for grounding the microwave component leaking out from the HIL 6*a* is connected parallel to the resistance 3*d*, and one end is grounded. At a terminal end of the MSL 4*a*, a series circuit of a high frequency resistance 3*b* and MSL 4*c* of which one end is released, having a length of $\lambda g/4$ is connected as shown in the diagram, and a resistive terminal end is formed in the MSL 4*a*. Herein, $\lambda g$ is the guide wavelength of the MSL 4*c* corresponding to the oscillation frequency. (Hereinafter, $\lambda g$ is meant as the guide wavelength determined by the corresponding MSL. The value of $\lambda g$ varies with the line width of MSL, thickness of circuit board, and dielectric constant.)

The MSL 4*b* is connected to the collector of transistor 1, and in this line 4*b*, a choke circuit of HIL 6*b* and MSL 4*f* and a dc resistance 3*a* are connected as shown in the diagram, and one end of the resistance 3*a* is connected to a bias supply terminal 2*a* of the transistor, and a bias voltage is applied to the collector terminal therefrom. A capacitor 7*b* for grounding the microwave component leaking out from the HIL 6*b* is connected serially to the resistance 3*a*, and one end is grounded.

A hollow circular dielectric resonator (DR) 5 couples the MSL 4*a* and 4*b* electromagnetically, and is arranged so that the distance from its release end to the closest position to the center of the DR 5 may be $\lambda g/4$ on the MSL 4*b*.

In this configuration, by feeding back from the collector to the base of the transistor 1 through the DR 5, the oscillation frequency and oscillation power are stabilized at the frequency determined by the resonance frequency of the DR 5, and the oscillation power is delivered from an output terminal 8 through an impedance matching circuit 9 and a dc blocking capacitor 7*a* connected to the emitter of the transistor 1.

Meanwhile, the HIL 6*c* and MSL 4*e* connected to the matching circuit 9 form a choke circuit, and are used for preventing leak of microwave oscillation power and grounding the emitter of the transistor 1 in direct current.

This conventional configuration, however, requires choke circuits composed of HIL 6*a*, 6*b*, 6*c* and MSL 4*d*, 4*f*, 4*e* which are connected for applying a dc bias to the MSL 4*a*, 4*b* connected to the corresponding terminals of the transistor 1 and connected to the impedance matching circuit 9, and these choke circuits make it difficult to reduce the size of the microwave oscillator or induce deterioration of phase noise characteristics, generation of spurious oscillation, or other unstable oscillation.

SUMMARY OF THE INVENTION

A microwave oscillator is characterized by the configuration in which MSL A released at one end is connected to the base terminal of a transistor, MSL B is connected to the collector terminal, a DR is disposed closely to the MSL A and MSL B to couple them electromagnetically, and a stabilized oscillation output is obtained by inducing parallel feedback from the collector to the base, and further the center of the DR is set closest to the position at which the distance from the released end on the MSL A is $\lambda g1/4$, and HIL is merely connected to this position as a bias supply line to the base terminal, and therefore without using choke circuits which occupied a relatively wide area on the conventional circuit board, a small and stable microwave oscillator having excellent phase noise characteristics may be realized.

In other configuration, the MSL B connected to the collector terminal of the transistor is also released at one end, and the center of the DR is set closest to the position at which the distance from the released end on the MSL B is $\lambda g2/4$, and merely the HIL is connected as a bias supply line to the collector terminal, and therefore without using choke circuits conventionally added to the bias supply lines to both base and collector terminals, the size may be further reduced. Herein, $\lambda g2$ is the guide wavelength in the MSL B.

Further, using the FET instead of the transistor, MSL A with a released end is connected to its gate terminal, and MSL B is connected to the drain terminal, and a DR is disposed closely to the MSL A and B to couple them electromagnetically, and a stabilized oscillation output is obtained by inducing a parallel feedback from the drain to the gate, and the center of the DR is set closest to the position at which the distance from the released end on the MSL A is $\lambda g1/4$, and HIL is merely connected as a bias supply line to the gate terminal, and therefore without using choke circuits which occupied a relatively wide area on the conventional circuit board, a small and stable microwave oscillator having excellent phase noise characteristics may be realized.

In a different configuration, the MSL B connected to the drain terminal of the FET is also released at one end, and the center of the DR is set closest to the position at which the distance from the released end on the MSL B is λg2/4, and merely the HIL is connected as a bias supply line to the drain terminal, and therefore without using choke circuits conventionally added to the bias supply lines to both gate and drain terminals, the size may be further reduced.

By using any one of such microwave oscillators in the local oscillator for the low-noise converter for receiving satellite signal composed of a probe for converting the satellite signal in the circular waveguide obtained from a satellite signal receiving antenna into MSL mode, a low-noise amplifier, a mixer, a local oscillator, and an IF amplifier, a small and stable low-noise converter for receiving satellite signal having excellent phase noise characteristics may be realized.

Thus, by connecting the MSL released at one end to the base and/or collector terminal of the transistor or to the gate and/or drain terminal of the FET, setting the center of the DR closest to the position at which the distance from the released end on the MSL is λg/4, and merely connecting the HIL as a bias supply line to each terminal of the transistor or FET, conventional choke circuits are omitted, and a small and stable microwave oscillator having excellent phase noise characteristics and a low-noise converter for receiving satellite signal by using it are presented.

DESCRIPTION OF THE PREFERRED EMBODIMENTS

Figure 1:
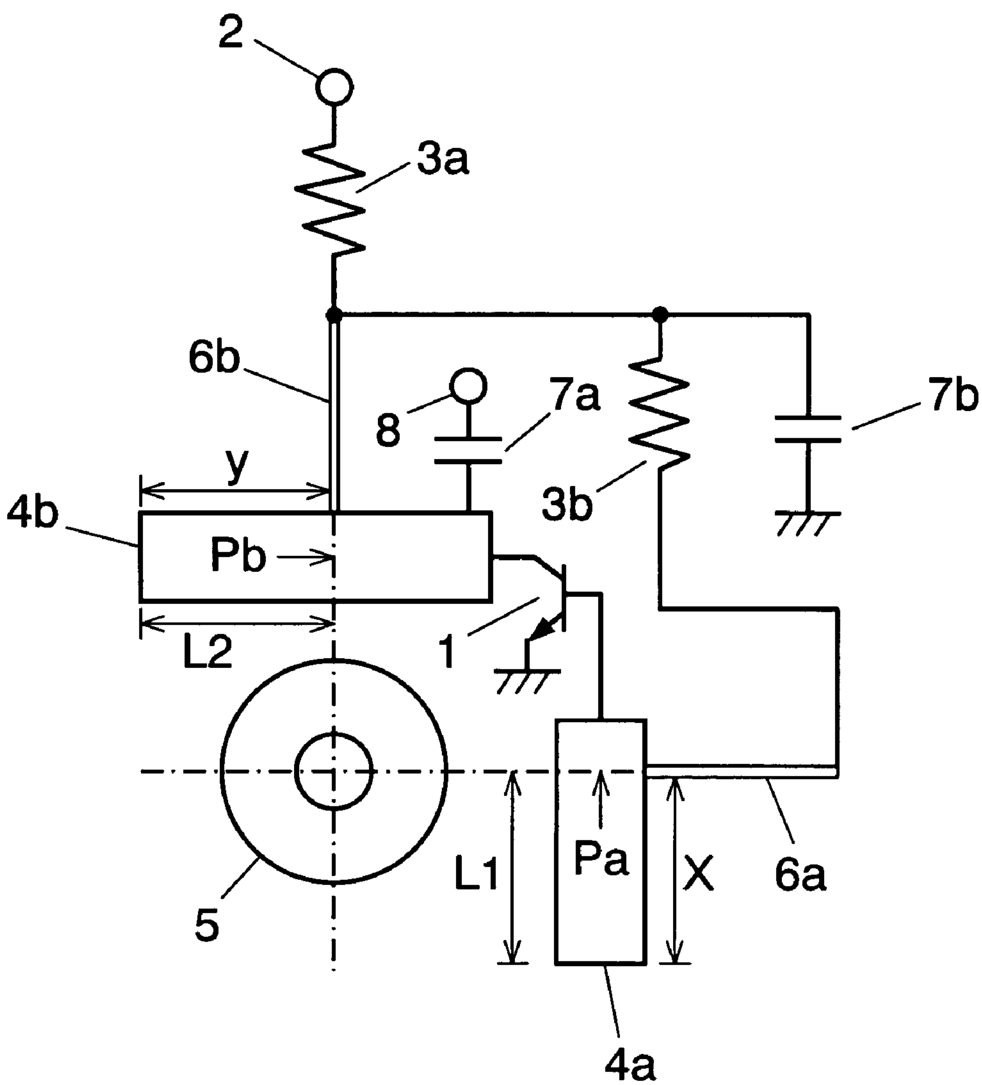
FIG. 1 is a circuit diagram of a microwave oscillator in embodiment 1 and embodiment 2 of the invention.

Referring now to the drawings, preferred embodiments of the invention are described below.

(Embodiment 1)

A circuit diagram of a microwave oscillator in embodiment 1 of the invention is shown in FIG. 1.

At a base terminal of a transistor 1, MSL 4*a* with a released end is connected, and HIL 6*a* and dc resistance 3*b* are connected serially to the side of line 4*a* as shown in FIG. 1, one end of the resistance 3*b* is connected to a bias voltage supply terminal 2 through dc resistance 3*a*, and a bias voltage is applied to the base terminal therefrom. At a collector terminal of the transistor 1, same as in the case of the base terminal, MSL 4*b* with a released end is connected, and HIL 6*b* and dc resistance 3*a* are connected serially to the side of line 4*b* as shown in FIG. 1, and led to the bias voltage supply terminal 2, and a bias voltage is applied to the collector terminal therefrom. The emitter terminal is directly grounded. On the other hand, in order to stabilize the oscillation, a DR 5 is disposed so that the position at which the distance from the released end on the MSL 4*a* and MSL 4*b* lines is L1 and L2 may be closest to the center of the DR 5. Setting L1 and L2 respectively at λg1/4 and λg2/4 (λg1 and λg2 are guide wavelengths of MSL 4*a* and MSL 4*b* respectively at the resonance frequency of DR 5), the MSL 4*b* connected to the collector and the MSL 4*a* connected to the base terminal are electromagnetically coupled through the DR 5, and a parallel feedback is induced between the collector and base of the transistor, and hence a microwave oscillation is stabilized at a desired frequency by the DR 5. This oscillation power is obtained from an output terminal 8 through a dc blocking capacitor 7*a*.

Figure 6:
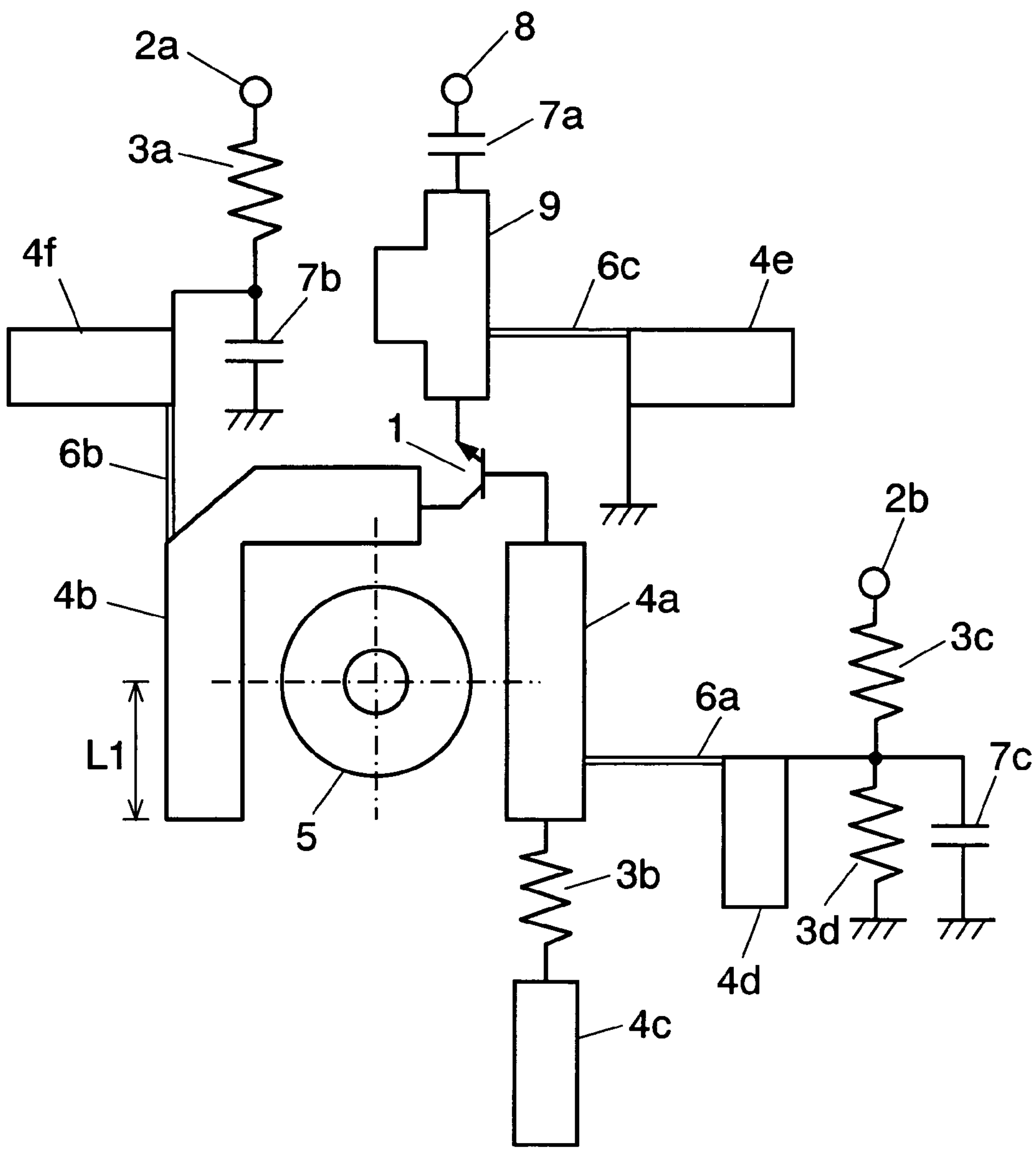
FIG. 6 is a circuit diagram of a microwave oscillator in a prior art.

Supposing the position on the line 4*a* closest to the center of the DR 5 from the released end of the MSL 4*a* to be Pa, and the distance from the released end of the line 4*a* to the HIL 6*a* to be x, the distance from the released end to Pa is λg1/4 (L1=λg1/4), and hence the line 4*a* is in short-circuited state at Pa, and as seeing the released end of the line 4*a* from Pa, the impedance Z(Pa) is a sufficiently small value. Therefore, when the HIL 6*a* is connected at this position of Pa, that is, when set at x=L1, the impedance of seeing the HIL 6*a* from the position of Pa is a sufficiently large value as compared with Z(Pa) without using choke circuit with a stab 4*d* in the prior art shown in FIG. 6, and it is possible to suppress sufficiently leak of the microwave electromagnetic field of the MSL 4*a* to the HIL 6*a*. Therefore, a small and stable microwave oscillator having excellent phase noise characteristics may be realized.

Figure 5:
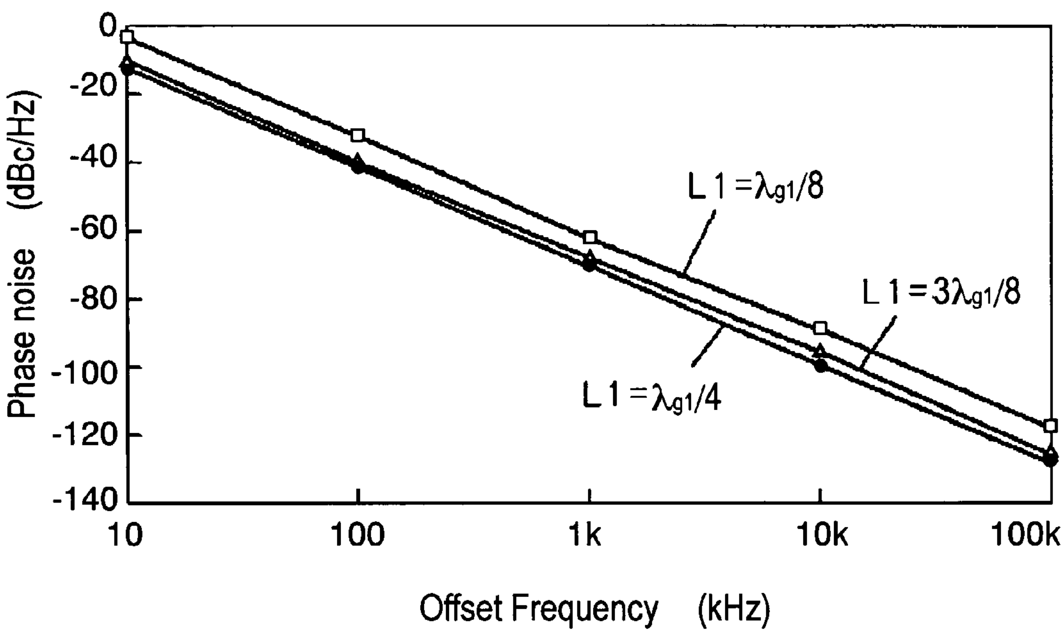
FIG. 5 is a diagram showing phase noise characteristics of the microwave oscillator in embodiment 6 of the invention.

FIG. 5 shows phase noise characteristics of microwave oscillation output at λg1/8, λg1/4, and 3λg1/8. It is known from this diagram that the most favorable phase noise characteristics will be obtained at L1=λg1/4.

In this embodiment, a voltage feedback system is used in the bias method of the transistor 1, but similar effects are obtained by other bias method such as current feedback system. Of course, same effects are obtained by using interdigital filter by MSL or the like in the dc blocking capacitor 7*a*.

(Embodiment 2)

A circuit diagram of a microwave oscillator of this embodiment is same as that of embodiment 1 shown in FIG. 1. In this embodiment, supposing the distance from the released end of MSL 4*b* connected to a collector terminal of the transistor 1 to the HIL 6*b* to be y, and the position on the line 4*b* closest to the center of the DR 5 from the released end of the MSL 4*b* to be Pb, the distance from the released end to Pb is λg2/4 (L2=λg2/4), and hence the line 4*b* is in short-circuited state at Pb, as seeing the released end of the line 4*b* from Pb, the impedance Z(Pb) is a sufficiently small value. Therefore, when the HIL 6*b* is connected at this position of Pb, that is, when set at y=L2, the impedance of seeing the HIL 6*b* from the position of Pb is, same as in embodiment 1, a sufficiently large value as compared with Z(Pb) without using choke circuit with a stab 4*f* in the prior art shown in FIG. 5, and it is possible to suppress sufficiently leak of the microwave electromagnetic field of the MSL 4*b* to the HIL 6*b*. Therefore, a small and stable microwave oscillator having excellent phase noise characteristics may be realized.

In this embodiment, too, the bias method of the transistor 1 and dc blocking capacitor 7*a* may be varied same as in embodiment 1.

(Embodiment 3)

Figure 2:
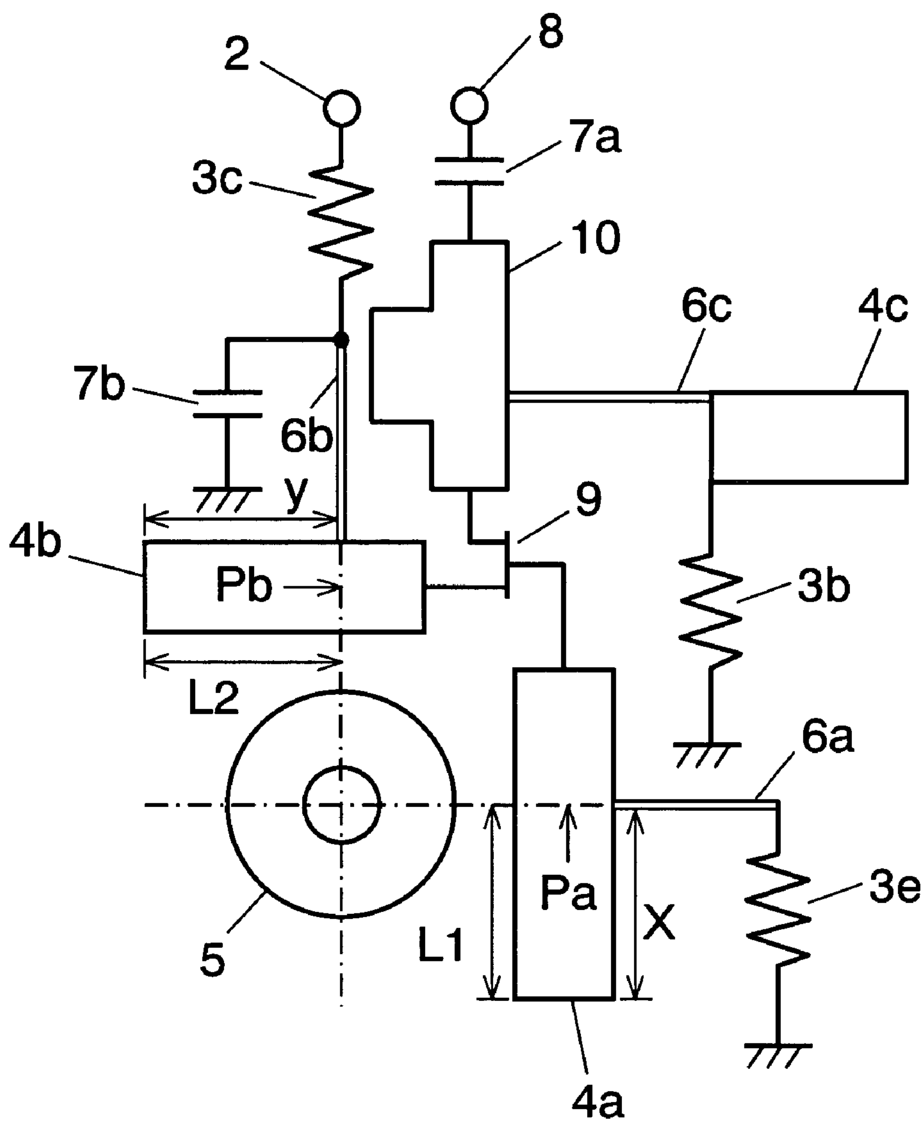
FIG. 2 is a circuit diagram of a microwave oscillator in embodiment 3 and embodiment 4 of the invention.

A circuit diagram of a microwave oscillator in embodiment 3 of the invention is shown in FIG. 2. At a gate terminal of FET 9, MSL 4*a* with a released end is connected, and HIL 6*a* and dc resistance 3*e* are connected serially to the side of line 4*a* as shown in FIG. 2, and one end of the resistance 3*e* is grounded. At a drain terminal of the FET 9, same as in the case of the gate terminal, MSL 4*b* with a released end is connected. At a side of the line 4*b*, as shown in FIG. 2, one end of HIL 6*b* is connected, and a dc resistance 3*c* and capacitor 7*b* are connected to other end, and the resistance 3*c* is led into a bias voltage supply terminal 2, from which a bias voltage is applied to the FET 9. The capacitor 7*b* is provided for grounding the microwave component leaking out from the HIL 6*b*. At a source terminal, one end of a impedance matching circuit 10 is connected, and other end is connected to an output terminal 8 through a dc blocking capacitor 7*a*. At the side of the circuit 10, as shown in FIG. 2, a choke circuit composed of HIL 6*c* and stab 4*c* and a dc resistance 3*d* are connected serially, and one end of the resistance 3*d* is grounded. On the other hand, to stabilize the oscillation, a DR 5 is disposed so that the position at which the distance from the released end on the MSL 4*a* and MSL 4*b* lines is L1 and L2 may be closest to the center of the DR 5. Setting L1 and L2 respectively at λg1/4 and λg2/4 (λg1 and λg2 are guide wavelengths of MSL 4*a* and MSL 4*b* respectively at the resonance frequency of DR 5), the MSL 4*b* connected to the drain terminal and the MSL 4*a* connected to the gate terminal are electromagnetically coupled through the DR 5, and a parallel feedback is induced between the drain and gate of the FET, and hence a microwave oscillation is stabilized at a desired frequency by the DR 5. This oscillation power is obtained from an output terminal 8 through an impedance matching circuit 10 and a dc blocking capacitor 7*a*.

Supposing the position on the line 4*a* closest to the center of the DR 5 from the released end of the MSL 4*a* to be Pa, and the distance from the released end of the line 4*a* to the HIL 6*a* to be x, the distance from the released end to Pa is λg1/4 (L1=λg1/4), and hence the line 4*a* is in short-circuited state at Pa, and as seeing the released end of the line 4*a* from Pa, the impedance Z(Pa) is a sufficiently small value. Therefore, when the HIL 6*a* is connected at this position of Pa, that is, when set at x=L1, the impedance of seeing the HIL 6*a* from the position of Pa is a sufficiently large value as compared with Z(Pa) without using choke circuit with a stab 4*d* in the prior art shown in FIG. 5, and it is possible to suppress sufficiently leak of the microwave electromagnetic field of the MSL 4*a* to the HIL 6*a*. Therefore, a small and stable microwave oscillator having excellent phase noise characteristics may be realized.

Of course, same effects are obtained by using interdigital filter by MSL or the like in the dc blocking capacitor 7*a*.

(Embodiment 4)

A circuit diagram of a microwave oscillator of this embodiment is same as that of embodiment 3 shown in FIG. 2. In this embodiment, supposing the distance from the released end of MSL 4*b* connected to a drain terminal of the FET 9 to the HIL 6*b* to be y, and the position on the line 4*b* closest to the center of the DR 5 from the released end of the MSL 4*b* to be Pb, the distance from the released end to Pb is λg2/4 (L2=λg2/4), and hence the line 4*b* is in short-circuited state at Pb, as seeing the released end of the line 4*b* from Pb, the impedance Z(Pb) is a sufficiently small value. Therefore, when the HIL 6*b* is connected at this position of Pb, that is, when set at y=L2, the impedance of seeing the HIL 6*b* from the position of Pb is, same as in embodiment 3, a sufficiently large value as compared with Z(Pb) without using choke circuit with a stab 4*f* in the prior art shown in FIG. 6, and it is possible to suppress sufficiently leak of the microwave electromagnetic field of the MSL 4*b* to the HIL 6*b*. Therefore, a small and stable microwave oscillator having excellent phase noise characteristics may be realized.

In this embodiment, too, the dc blocking capacitor 7*a* may be varied same as in embodiment 3.

(Embodiment 5)

Figure 3:
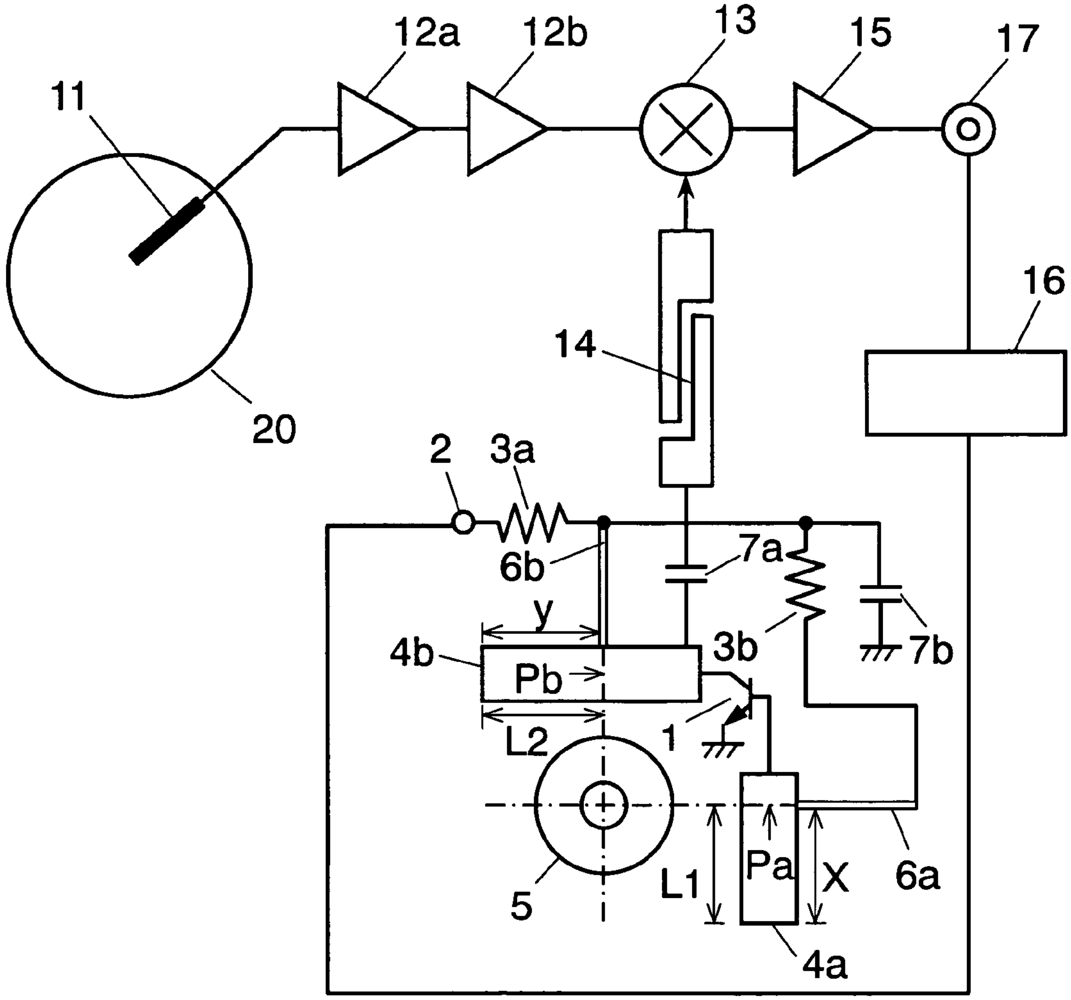
FIG. 3 is a block diagram of a microwave oscillator in embodiment 5 of the invention.

A block diagram of a low-noise converter for receiving satellite signal in embodiment 5 of the invention is shown in FIG. 3.

A satellite signal received by a receiving antenna is led into a circular waveguide 20, converted into MSL mode by a probe 11 provided in the guide, and amplified by a low-noise amplifier, and sent into a mixer 13 to be converted down to an intermediate frequency. As a local oscillator for feeding a local oscillation signal into the mixer 13, the microwave oscillator in embodiment 1 is used. That is, by connecting the HIL 6*a* for bias voltage supply to be applied to the base terminal of the transistor 1 from the released end of the MSL 4*a* to the position Pa of λg1/4 (x=λg1/4 ), this microwave oscillator does not require a choke circuit. In FIG. 3, the output signal of the microwave oscillator of embodiment 1 is supplied from the dc blocking capacitor 7*a* into the mixer 13 through a band-pass filter 14 formed of MSL, and the bias supply terminal 2 of the transistor 1 is connected to a stabilized dc power supply circuit 16. In the mixer 13, the satellite signal and local oscillation signal are mixed, and the IF component is taken out from the output port of the mixer 13, amplified in an IF amplifier 15, and led to an IF output terminal 17 and delivered outside. On the other hand, the dc voltage to be supplied to the stabilized dc power supply circuit is superposed on the IF output signal from outside, and is applied from the output terminal 17.

Thus, in this embodiment, since the microwave oscillator in embodiment 1 is used in the low-noise converter for receiving satellite signal as the local oscillator, a small and stable low-noise converter for receiving satellite signal having excellent phase noise characteristics is realized.

FIG. 5 shows phase noise characteristics of microwave oscillation output at λg1/8, λg1/4, and 3λg1/8. It is known from this diagram that the most favorable phase noise characteristics will be obtained at L1=λg1/4.

(Embodiment 6)

A block diagram of a low-noise converter of this embodiment is same as that of embodiment 5 shown in FIG. 3.

In this embodiment, the microwave oscillator in embodiment 2 is used as the local oscillator for generating local oscillation signal. That is, by connecting the HIL 6*b* for bias voltage supply to be applied to the collector terminal of the transistor 1 from the released end of the MSL 4*b* to the position Pb of λg2/4 (y=λg2/4), this microwave oscillator does not require a choke circuit. Thus, in this embodiment, since the microwave oscillator in embodiment 2 is used in the low-noise converter for receiving satellite signal as the local oscillator, a small and stable low-noise converter for receiving satellite signal having excellent phase noise characteristics is realized.

(Embodiment 7)

Figure 4:
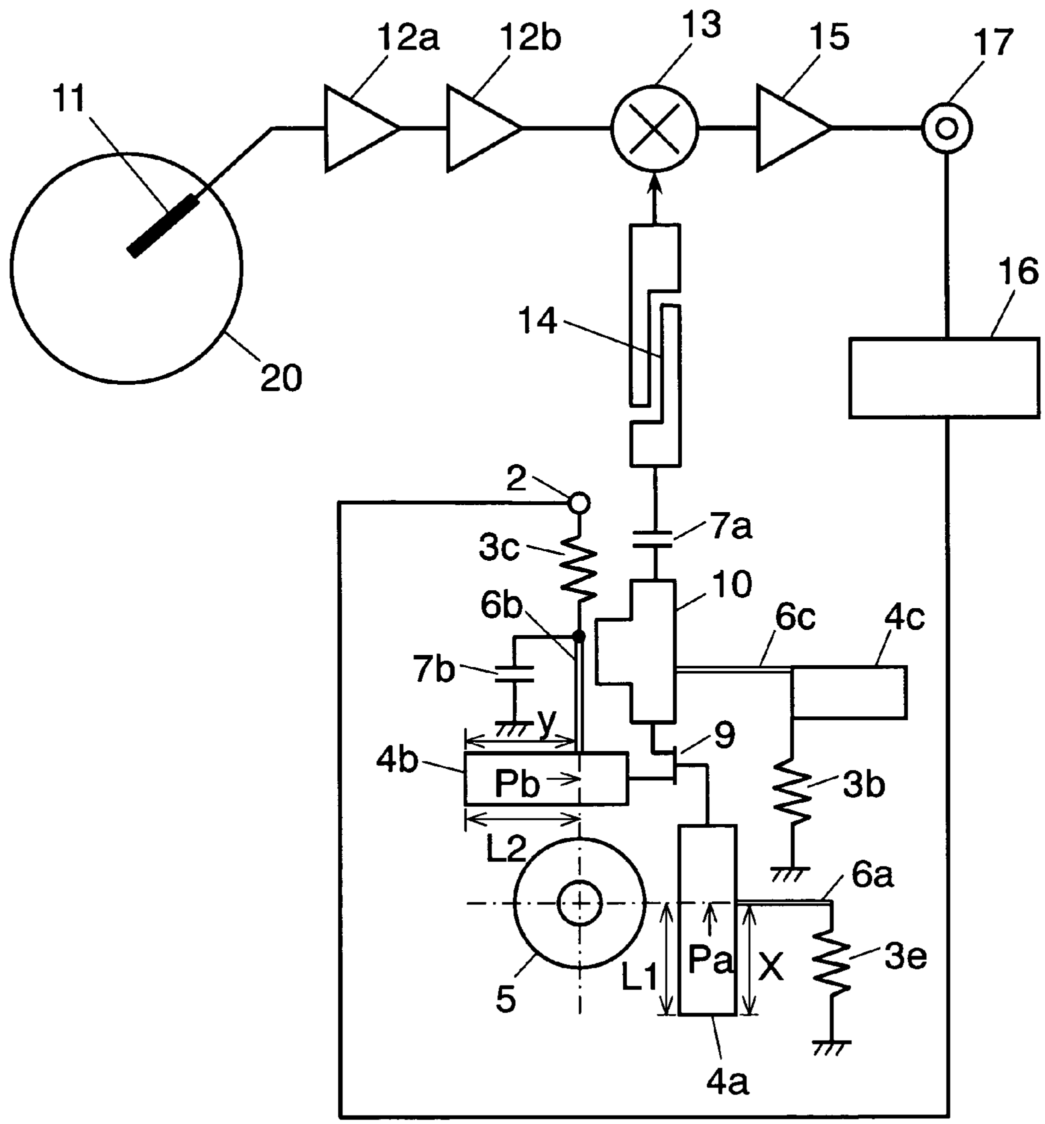
FIG. 4 is a block diagram of a microwave oscillator in embodiment 6 of the invention.

A block diagram of a low-noise converter for receiving satellite signal in embodiment 7 of the invention is shown in FIG. 4.

A satellite signal received by a receiving antenna is led into a circular waveguide 20, converted into MSL mode by a probe 11 provided in the guide, and amplified by a low-noise amplifier, and sent into a mixer 13 to be converted down to an intermediate frequency. As a local oscillator for feeding a local oscillation signal into the mixer 13, the microwave oscillator in embodiment 3 is used. That is, by connecting the HIL 6*a* for bias voltage supply to be applied to the gate terminal of the FET 9 from the released end of the MSL 4*a* to the position Pa of λ/4 (x=λg1/4), this microwave oscillator does not require a choke circuit. In FIG. 4, the output signal of the microwave oscillator of embodiment 3 is supplied from the dc blocking capacitor 7*a* into the mixer 13 through a band-pass filter 14 formed of MSL, and the bias supply terminal 2 of the FET 9 is connected to a stabilized dc power supply circuit 16. In the mixer 13, the satellite signal and local oscillation signal are mixed, and the IF component is taken out from the output port of the mixer 13, amplified in an IF amplifier 15, and led to an IF output terminal 17 and delivered outside. On the other hand, the dc voltage to be supplied to the stabilized dc power supply circuit is superposed on the IF output signal from outside, and is applied from the output terminal 17.

Thus, in this embodiment, since the microwave oscillator in embodiment 3 is used in the low-noise converter for receiving satellite signal as the local oscillator, a small and stable low-noise converter for receiving satellite signal having excellent phase noise characteristics is realized.

(Embodiment 8)

A block diagram of a low-noise converter of this embodiment is same as that of embodiment 7 shown in FIG. 4.

In this embodiment, the microwave oscillator in embodiment 4 is used as the local oscillator for generating local oscillation signal. That is, by connecting the HIL 6*b* for bias voltage supply to be applied to the drain terminal of the FET 9 from the released end of the MSL 4*b* to the position Pb of $\lambda g2/4$ ($y=\lambda g2/4$), this microwave oscillator does not require a choke circuit. Thus, in this embodiment, since the microwave oscillator in embodiment 4 is used in the low-noise converter for receiving satellite signal as the local oscillator, a small and stable low-noise converter for receiving satellite signal having excellent phase noise characteristics is realized.

Thus, by connecting the MSL released at one end to the base and/or collector terminal of the transistor or to the gate and/or drain terminal of the FET, setting the center of the DR closest to the position at which the distance from the released end on the MSL is $\lambda g/4$, and merely connecting the HIL as a bias supply line to each terminal of the transistor or FET, conventional choke circuits are omitted, and a small and stable microwave oscillator having excellent phase noise characteristics and a low-noise converter for receiving satellite signal by using it are presented.

What is claimed is:

1. A microwave oscillator for inducing parallel feedback from collector to a base of a bipolar transistor, comprising:

(a) a first microstrip line with a released end coupled to said base terminal, (b) a second microstrip line with a released end coupled to said collector terminal, (c) a dielectric resonator electromagnetically coupled to said first microstrip line and said second microstrip line, and (d) a high impedance line for bias supply to said base terminal directly coupled to said first microstrip line at a position where a distance from the released end on said first microstrip line to a point closest to a center of said dielectric resonator is $\lambda g1/4$, wherein $\lambda g1$ is a guide wavelength of the first microstrip line at an oscillation frequency of said microwave oscillator.

2. A microwave oscillator for inducing parallel feedback from a collector to a base of a bipolar transistor, comprising:

(a) a first microstrip line with a released end coupled to said base terminal, (b) a second microstrip line with a released end coupled to said collector terminal, (c) a dielectric resonator electromagnetically coupled to said first microstrip line and said second microstrip line, (d) a high impedance line for bias supply to said base terminal directly coupled to said first microstrip line at a position where a distance from the released end on said first microstrip line to a point closest to a center of said dielectric resonator is $\lambda g1/4$, and (e) a high impedance line for bias supply to said collector terminal coupled at a position where the distance from the released end on said second microstrip line to the point closest to the center of said dielectric resonator is $\lambda g2/4$, wherein $\lambda g1$ and $\lambda g2$ are a guide wavelengths of the first microstrip line and the second microstrip line respectively at the oscillation frequency of said microwave oscillator.

3. A microwave oscillator for inducing parallel feedback from a drain to a gate of a field effect transistor, comprising:

(a) a first microstrip line with a released end coupled to said gate terminal, (b) a second microstrip line with a released end coupled to said drain terminal, (c) a dielectric resonator electromagnetically coupled to said first microstrip line and said second microstrip line, and (d) a high impedance line for bias supply to said gate terminal directly coupled to said first microstrip line at a position where a distance from the released end on said first microstrip line to a point closest to a center of said dielectric resonator is $\lambda g1/4$, wherein $\lambda g1$ is a guide wavelength of the first microstrip line at an oscillation frequency of said microwave oscillator.

4. A microwave oscillator for inducing parallel feedback from a drain to a gate of a field effect transistor, comprising:

(a) a first microstrip line with a released end coupled to said gate terminal, (b) a second microstrip line with a released end coupled to said drain terminal, (c) a dielectric resonator electromagnetically coupled to said first microstrip line and said second microstrip line, (d) a high impedance line for bias supply to said gate terminal directly coupled to said first microstrip line at a position where a distance from the released end on said first microstrip line to a point closest to a center of said dielectric resonator is $\lambda g1/4$, and (e) a high impedance line for bias supply to said drain terminal coupled at a position where the distance from the released end on said second microstrip line to the point closest to the center of said dielectric resonator is $\lambda g2/4$, wherein $\lambda g1$ and $\lambda g2$ are a guide wavelengths of the first microstrip line and the second microstrip line respectively at the oscillation frequency of said microwave oscillator.

5. A low-noise converter incorporated in a microwave receiving antenna comprising:

(a) a waveguide for transmitting a satellite signal received in said receiving antenna, (b) a waveguide probe for converting the satellite signal in said waveguide into a microstrip line mode, (c) a low-noise amplifier of which input port is coupled to said waveguide probe, (d) a mixer for receiving an output signal of said low-noise amplifier, and (e) a local oscillator of which output port is coupled to said mixer, wherein said local oscillator includes a microwave oscillator for inducing parallel feedback from collector to a base of a bipolar transistor, comprising:

(i) a first microstrip line with a released end coupled to said base terminal, (ii) a second microstrip line with a released end coupled to said collector terminal, (iii) a dielectric resonator electromagnetically coupled to said first microstrip line and said second microstrip line, and (iv) a high impedance line for bias supply to said base terminal directly coupled to said first microstrip line at a position where a distance from the released end on said first microstrip line to a point closest to a center of said dielectric resonator is λg1/4, wherein λg1 is a guide wavelength of the first microstrip line at an oscillation frequency of said microwave oscillator.

6. A low-noise converter incorporated in a microwave receiving antenna comprising:

(a) a waveguide for transmitting a satellite signal received in said receiving antenna, (b) a waveguide probe for converting the satellite signal in said waveguide into a microstrip line mode, (c) a low-noise amplifier of which input port is coupled to said waveguide probe, (d) a mixer for receiving the output signal of said low-noise amplifier, and (e) a local oscillator of which output port is coupled to said mixer, wherein said local oscillator includes a microwave oscillator for inducing parallel feedback from a collector to a base of a bipolar transistor, comprising:

(i) a first microstrip line with a released end coupled to said base terminal, (ii) a second microstrip line with a released end coupled to said collector terminal, (iii) a dielectric resonator electromagnetically coupled to said first microstrip line and said second microstrip line, (iv) a high impedance line for bias supply to said base terminal directly coupled to said first microstrip line at a position where a distance from the released end on said first microstrip line to a point closest to a center of said dielectric resonator is λg1/4, and (v) a high impedance line for bias supply to said collector terminal coupled at a position where the distance from the released end on said second microstrip line to the point closest to the center of said dielectric resonator is λg2/4, wherein λg1 and λg2 are a guide wavelengths of the first microstrip line and the second microstrip line respectively at the oscillation frequency of said microwave oscillator.

7. A low-noise converter incorporated in a microwave receiving antenna comprising:

(a) a waveguide for transmitting a satellite signal received in said receiving antenna, (b) a waveguide probe for converting the satellite signal in said waveguide into a microstrip line mode, (c) a low-noise amplifier of which input port is coupled to said waveguide probe, (d) a mixer for receiving the output signal of said low-noise amplifier, and (e) a local oscillator of which output port is coupled to said mixer, wherein said local oscillator includes a microwave oscillator for inducing parallel feedback from a drain to a gate of a field effect transistor, comprising:

(i) a first microstrip line with a released end coupled to said gate terminal, (ii) a second microstrip line with a released end coupled to said drain terminal, (iii) a dielectric resonator electromagnetically coupled to said first microstrip line and said second microstrip line, and (iv) a high impedance line for bias supply to said gate terminal directly coupled to said first microstrip line at a position where a distance from the released end on said first microstrip line to a point closest to a center of said dielectric resonator is λg1/4, wherein λg1 is a guide wavelength of the first microstrip line at an oscillation frequency of said microwave oscillator.

8. A low-noise converter incorporated in a microwave receiving antenna comprising:

(a) a waveguide for transmitting a satellite signal received in said receiving antenna, (b) a waveguide probe for converting the satellite signal in said waveguide into a microstrip line mode, (c) a low-noise amplifier of which input port is coupled to said waveguide probe, (d) a mixer for receiving the output signal of said low-noise amplifier, and (e) a local oscillator of which output port is coupled to said mixer, wherein said local oscillator includes a microwave oscillator for inducing parallel feedback from a drain to a gate of a field effect transistor, comprising:

(i) a first microstrip line with a released end coupled to said gate terminal, (ii) a second microstrip line with a released end coupled to said drain terminal, (iii) a dielectric resonator electromagnetically coupled to said first microstrip line and said second microstrip line, (iv) a high impedance line for bias supply to said gate terminal directly coupled to said first microstrip line at a position where a distance from the released end on said first microstrip line to a point closest to a center of said dielectric resonator is λg1/4, and (v) a high impedance line for bias supply to said drain terminal coupled at a position where the distance from the released end on said second microstrip line to the point closest to the center of said dielectric resonator is λg2/4, wherein λg1 and λg2 are a guide wavelengths of the first microstrip line and the second microstrip line respectively at the oscillation frequency of said microwave oscillator.

* * * * *